(12) United States Patent
Hong et al.

(10) Patent No.: US 7,802,164 B2
(45) Date of Patent: Sep. 21, 2010

(54) APPARATUS AND METHOD FOR ENCODING/DECODING BLOCK LOW DENSITY PARITY CHECK CODES HAVING VARIABLE CODING RATE

(75) Inventors: Song-Nam Hong, Seoul (KR);
Hyun-Jeong Kang, Seoul (KR);
Jung-Je Son, Seongnam-si (KR);
Jae-Weon Cho, Suwon-si (KR);
Hyoung-Kyu Lim, Seoul (KR);
Sung-Jin Lee, Suwon-si (KR);
Mi-Hyun Lee, Seoul (KR);
Yeong-Moon Son, Anyang-si (KR);
Young-Ho Kim, Suwon-si (KR);
Pan-Yuh Joo, Seoul (KR)

(73) Assignee: Samsung Electronics Co., Ltd (KR)

( * ) Notice: Subject to any disclaimer, the term of this patent is extended or adjusted under 35 U.S.C. 154(b) by 1030 days.

(21) Appl. No.: 11/527,193

(22) Filed: Sep. 26, 2006

(65) Prior Publication Data

US 2007/0089025 A1    Apr. 19, 2007

(30) Foreign Application Priority Data

Sep. 26, 2005  (KR) ...................... 10-2005-0089561

(51) Int. Cl.
*H03M 13/00*    (2006.01)

(52) U.S. Cl. ........................ 714/752; 714/751; 714/774

(58) Field of Classification Search ............ 714/752, 714/755, 761, 774, 776, 790
See application file for complete search history.

(56) References Cited

U.S. PATENT DOCUMENTS

| 7,222,284 B2 * | 5/2007 | Stolpman .................... 714/774 |
| 2004/0098659 A1 * | 5/2004 | Bjerke et al. ................ 714/776 |
| 2004/0255229 A1 | 12/2004 | Shen et al. |

FOREIGN PATENT DOCUMENTS

| KR | 1020010037341 | 5/2001 |
| KR | 1020050066964 | 6/2005 |
| KR | 1020060047842 | 5/2006 |
| KR | 1020070009244 | 1/2007 |
| WO | WO 2005/015748 | 2/2005 |

* cited by examiner

*Primary Examiner*—Fritz Alphonse
(74) *Attorney, Agent, or Firm*—The Farrell Law Firm, LLP

(57) ABSTRACT

A method for encoding a rate-compatible block Low Density Parity Check (LDPC) code. The method includes designing specific LDPC codes for a predetermined number of coding rates, and generating a pruning pattern by comparing information node degrees of the predetermined number of LDPC codes; matching check node degrees of the predetermined number of LDPC codes; generating a predetermined number of puncturing patterns according to the check node degree when the matched check node degree is calculated; determining whether a first condition given for the generated puncturing patterns is satisfied; and determining the generated puncturing patterns as rate-compatible puncturing patterns when the puncturing patterns satisfy the first condition.

17 Claims, 10 Drawing Sheets

$$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

APPARATUS AND METHOD FOR ENCODING/DECODING BLOCK LOW DENSITY PARITY CHECK CODES HAVING VARIABLE CODING RATE

PRIORITY

This application claims the benefit under 35 U.S.C. §119(a) of an application filed in the Korean Intellectual Property Office on Sep. 26, 2005 and assigned Serial No. 2005-89561, the entire contents of which are incorporated herein by reference.

BACKGROUND OF THE INVENTION

1. Field of the Invention

The present invention relates generally to a communication system, and in particular, to an apparatus and method for encoding/decoding Block Low Density Parity Check (LDPC) codes having a variable coding rate.

2. Description of the Related Art

With the rapid development of communication systems, there is a need for the development of a technology capable of transmitting high-capacity data approaching the capacity of wire networks even in wireless networks. Due to the demand for a high-speed, high-capacity communication system capable of processing and transmitting various information, such as video, multimedia and wireless data, as well as voice service data, increasing system transmission efficiency using an appropriate channel coding scheme serves as an essential factor for improvement of system performance. However, communication systems, due to their characteristics, may inevitably suffer from errors caused by noise, interference, fading, etc., according to channel conditions during data transmission. Therefore, communication systems suffer a loss of information data due to error.

In order to reduce information data loss caused by error, communication systems use various error control schemes according to channel characteristics, thereby contributing to improvement of system reliability. Of error control schemes, an error correction code-based error control scheme is widely used.

Typical error correction codes include turbo codes and Low Density Parity Check (LDPC) codes.

It is well known that turbo codes are superior in performance gain to a convolutional code conventionally used for error correction, during high-speed data transmission. Turbo codes are advantageous because they can efficiently correct errors caused by noise generated in a transmission channel, thereby increasing reliability of data transmission.

In addition, an LDPC code can be decoded using an iterative decoding process based on a sum-product process in a factor graph. Because a decoder for an LDPC code uses a sum-product process-based iterative decoding process, it is lower in complexity than a decoder for turbo codes. In addition, a decoder for an LDPC code is easy to implement with a parallel processing decoder, compared with a decoder for turbo codes.

Meanwhile, Shannon's channel coding theorem shows that reliable communication is possible only at a data rate not exceeding a channel capacity. However, Shannon's channel coding theorem has proposed no detailed channel coding/decoding methods for supporting a data rate up to the channel capacity limit. Although a random code having a very large block size shows performance approximating the channel capacity limit of Shannon's channel coding theorem, it is actually impossible to implement a Maximum A Posteriori (MAP) or Maximum Likelihood (ML) decoding method because of its heavy calculation load.

Turbo codes were proposed by Berrou, Glavieux and Thitimajshima in 1993, and have superior performance approximating the channel capacity limit of Shannon's channel coding theorem. The proposal of turbo codes triggered off an active research on iterative decoding and graphical expression of codes, and LDPC codes proposed by Gallager in 1962 are newly spotlighted in the research. Cycles exist in a factor graph of turbo codes and LDPC codes, and it is well known that iterative decoding in the factor graph of LDPC codes where cycles exist is suboptimal. Also, it has been experimentally proved that LDPC codes have excellent performance through iterative decoding. An LDPC code ever known to have the highest performance shows performance having a difference of only about 0.04 decibels (dB) at the channel capacity limit of Shannon's channel coding theorem at a bit error rate (BER) $10^{-5}$, using a block size $10^7$. In addition, although an LDPC code defined in Galois field (GF) with $q>2$, i.e. GF(q), increases in complexity in its decoding process, it is much superior in performance to a binary code. However, there has been provided no satisfactory theoretical description of successful decoding by an iterative decoding process for an LDPC code defined in GF(q).

LDPC codes, proposed by Gallager, are defined by a parity check matrix in which major elements have a value of 0 and minor elements, except elements having a value of 0, have a non-zero value, for example, a value of 1. For convenience, it will be assumed herein that the non-zero value is a value of 1.

For example, an (N, j, k) LDPC code is a linear block code having a block length N, and is defined by a sparse parity check matrix in which each column has j elements having a value of 1, each row has k elements having a value of 1, and all of the elements except for the elements having the value of 1 have a value of 0.

An LDPC code in which a weight of each column in the parity check matrix is fixed to 'j' and a weight of each row in the parity check matrix is fixed to 'k' as stated above, is called a "regular LDPC code." The "weight" refers to the number of elements having a non-zero value among the elements constituting the generating matrix and parity check matrix. Unlike the regular LDPC code, an LDPC code in which the weight of each column in the parity check matrix and the weight of each row in the parity check matrix are not fixed is called an "irregular LDPC code." It is generally known that the irregular LDPC code is superior in performance to the regular LDPC code. However, in the case of the irregular LDPC code, because the weight of each column and the weight of each row in the parity check matrix are not fixed, i.e. are irregular, the weight of each column in the parity check matrix and the weight of each row in the parity check matrix must be properly adjusted in order to guarantee the excellent performance.

With reference to FIG. 1, a description will now be made of a parity check matrix of an (8, 2, 4) LDPC code as an example of the (N, j, k) LDPC code.

FIG. 1 shows a parity check matrix of a general (8, 2, 4) LDPC code. A parity check matrix H of the (8, 2, 4) LDPC code is composed of 8 columns and 4 rows, wherein a weight of each column is fixed to 2 and a weight of each row is fixed to 4. Because the weight of each column and the weight of each row in the parity check matrix are regular, the (8, 2, 4) LDPC code shown in FIG. 1 is a regular LDPC code.

The parity check matrix of the (8, 2, 4) LDPC code has been described so far with reference to FIG. 1. Next, a factor graph of the (8, 2, 4) LDPC code described in connection with FIG. 1 will be described hereinbelow with reference to FIG. 2.

FIG. 2 shows a factor graph of the (8, 2, 4) LDPC code of FIG. 1. A factor graph of the (8, 2, 4) LDPC code is composed 8 variable nodes of $x_1$ 200, $x_2$ 202, $x_3$ 204, $x_4$ 206, $x_5$ 208, $x_6$ 210, $x_7$ 212 and $x_8$ 214, and 4 check nodes 216, 218, 220 and 222. When an element having a value of 1, i.e. a non-zero value, exists at the point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, it is possible to perform decoding through iterative decoding even in a block code having a relatively long size, that exhibits performance approximating a channel capacity limit of Shannon's channel coding theorem, such as a turbo code, while continuously increasing a block size of the block code. MacKay and Neal have proven that an iterative decoding process of an LDPC code using a flow transfer scheme approximates an iterative decoding process of a turbo code in performance.

In order to generate a high-performance LDPC code, the following conditions should be satisfied.

(1) Cycles in a factor graph of an LDPC code should be considered.

The term "cycle" refers to a loop formed by the edges connecting the variable nodes to the check nodes in a factor graph of an LDPC code, and a length of the cycle is defined as the number of edges constituting the loop. A long cycle means that the number of edges connecting the variable nodes to the check nodes constituting the loop in the factor graph of the LDPC code is large. In contrast, a short cycle means that the number of edges connecting the variable nodes to the check nodes constituting the loop in the factor graph of the LDPC code is small.

As cycles in the factor graph of the LDPC code become longer, the performance efficiency of the LDPC code increases, for the following reasons. That is, when long cycles are generated in the factor graph of the LDPC code, it is possible to prevent performance degradation, such as an error floor, occurring when too many cycles with a short length exist in the factor graph of the LDPC code.

(2) Efficient coding of an LDPC code should be considered.

It is difficult for the LDPC code to undergo real-time coding compared with a convolutional code or a turbo code because of its high coding complexity. In order to reduce the coding complexity of the LDPC code, a Repeat Accumulate (RA) code has been proposed. However, the RA code also has a limitation in reducing the coding complexity of the LDPC code. Therefore, efficient coding of the LDPC code should be taken into consideration.

(3) Degree distribution in a factor graph of an LDPC code should be considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution in a factor graph of an LDPC code" refers to a ratio of the number of nodes having a particular degree to the total number of nodes. It has been proven by Richardson that an LDPC code having a particular degree distribution is superior in performance.

Meanwhile, with the development of communication systems, various schemes such as a Hybrid Automatic Retransmission reQuest (HARQ) scheme and an Adaptive Modulation and Coding (AMC) scheme are used to increase resource efficiency while supporting high-capacity data transmission.

The HARQ scheme is classified into a Type-1 scheme and a Type-2 scheme. The Type-1 scheme is generally called a Chase Combining technique, and in the Type-1 scheme, information bits are encoded by a channel code having an appropriate coding rate before being transmitted. That is, if a receiver, after performing decoding, detects an error by a Cyclic Redundancy Code (CRC), it sends a retransmission request to a transmitter. Then the transmitter retransmits the same block as the transmitted block, and the receiver calculates a new received value by adding the newly received block to the previously received block in units of symbols or bits. Thereafter, the receiver performs decoding on the channel code using the calculated value.

It is known that among the currently proposed schemes, the Type-2 scheme shows the best performance. The Type-2 scheme can be used only for the channel code implemented such that it is rate-compatible. In a retransmission process, the Type-2 scheme transmits only the new parity bits rather than transmitting the same block as the previously transmitted block.

FIG. 3 shows a general Type-2 HARQ scheme. A hatched block shown by reference numeral 310 represents information bits, and hatched blocks shown by reference numeral 330 represent parity bits. A receiver generates a low-coding rate channel code by adding parity bits to the previously received data. In a retransmission process, the receiver performs decoding using a channel code having a lower coding rate than that used in the previous transmission process. In the Type-2 scheme, the performance is greatly affected by the method of designing a high-performance rate-compatible channel code.

In order to use the HARQ scheme and the AMC scheme, there is a need to support various coding rates. However, because the LDPC code has a limitation in terms of the coding rate as described above, it is difficult to support various coding rates. In addition, in order to use the HARQ scheme, it is necessary to create a code having various coding rates using one encoder. Therefore, there is a need for a method capable of creating LDPC codes having various coding rates using one encoder.

SUMMARY OF THE INVENTION

It is, therefore, an object of the present invention to provide an apparatus and method for encoding/decoding an LDPC code having a variable coding rate in a mobile communication system.

It is another object of the present invention to provide an apparatus and method for encoding/decoding an LDPC code having a variable coding rate, with minimized coding complexity, in a mobile communication system.

According to one aspect of the present invention, there is provided a method for encoding a rate-compatible block Low Density Parity Check (LDPC) code. The method includes designing specific LDPC codes for a predetermined number of coding rates, and generating a pruning pattern by comparing information node degrees of the predetermined number of LDPC codes; matching check node degrees of the predetermined number of LDPC codes; generating a predetermined number of puncturing patterns according to the check node degree when the matched check node degree is calculated; determining whether a first condition given for the generated puncturing patterns is satisfied; and determining the generated puncturing patterns as rate-compatible puncturing patterns when the puncturing patterns satisfy the first condition.

According to another aspect of the present invention, there is provided an apparatus for encoding a rate-compatible block Low Density Parity Check (LDPC) code. The apparatus includes an encoder for encoding information data into coded symbols with a predetermined coding scheme; a puncturing and pruning unit for puncturing a predetermined number of coded symbols from the coded symbols received from the encoder, the predetermined number corresponding to coding rate information set in a system; and a modulator for modulating the coded symbols into modulation symbols with a predetermined modulation scheme.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will now be described in detail with reference to the annexed drawings. In the following description, a detailed description of known functions and configurations incorporated herein has been omitted for clarity and conciseness.

The present invention provides an apparatus and method for encoding/decoding a block Low Density Parity Check (LDPC) code having a variable coding rate (hereinafter referred to as a "rate-compatible block LDPC code"). That is, the present invention provides an apparatus and method for encoding/decoding a rate-compatible block LDPC code, wherein a length of the minimum cycle in a factor graph of the block LDPC code is maximized, coding complexity of the block LDPC code is minimized, degree distribution in the factor graph of the block LDPC code has an optimal distribution of 1, and various coding rates are supported.

The next generation mobile communication system has developed into a packet service communication system, and the packet service communication system, a system for transmitting burst packet data to a plurality of mobile stations, has been designed such that it is suitable for high-capacity data transmission. In particular, various schemes such as a Hybrid Automatic Retransmission reQuest (HARQ) scheme and an Adaptive Modulation and Coding (AMC) scheme have been proposed to increase the data throughput, and because the HARQ scheme and the AMC scheme support a variable coding rate, there is a need for a block LDPC code supporting various coding rates.

The block LDPC code having various coding rates, i.e. having a variable coding rate, like the general LDPC code, is implemented through design of a parity check matrix. However, in order to provide a rate-compatible block LDPC code, i.e. in order to provide a block LDPC code having various coding rates, with one coder/decoder (codec) in the communication system, a parity check matrix capable of indicating a block LDPC code having different coding rates should be included in the parity check matrix. That is, there is a need to support more than two coding rates using one parity check matrix.

The typical schemes for supporting more than two coding rates using one parity check matrix include a shortening scheme, a puncturing scheme, an extending scheme, and a pruning scheme. A description will now be made of the shortening scheme, the puncturing scheme, the extending scheme, and the pruning scheme.

The shortening scheme fixes the number of rows in the parity check matrix and decreases the number of columns mapped to an information word to reduce a coding rate, and this scheme is usefully used for acquiring various coding rates for various codeword lengths. A description will now be made of an operation of generating a parity check matrix using the shortening scheme.

Figures 1, 2:
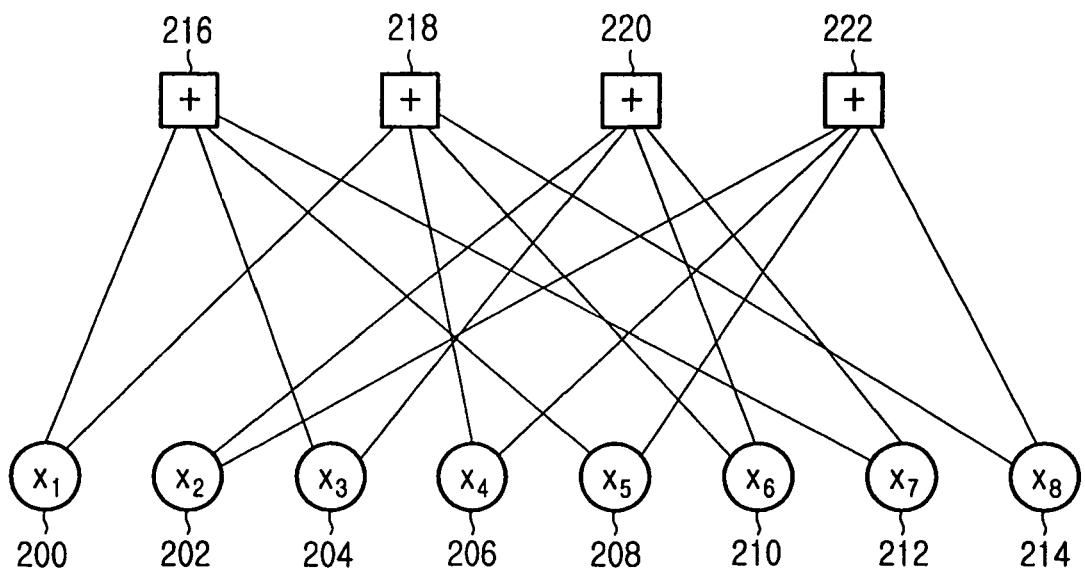
FIG. 1 is a diagram illustrating a parity check matrix of a general (8, 2, 4) LDPC code.
FIG. 2 is a diagram illustrating a factor graph of the (8, 2, 4) LDPC code of FIG. 1.
Figure 3:
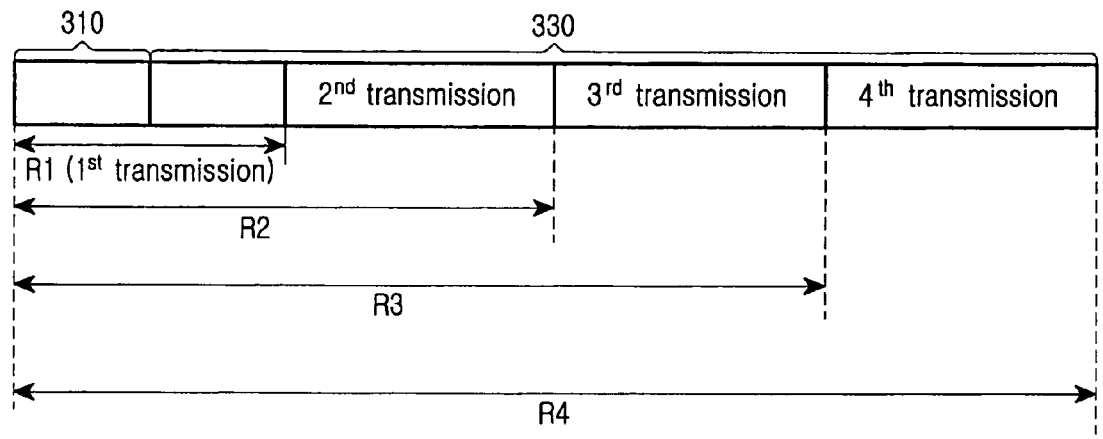
FIG. 3 is a diagram illustrating a general Type-2 HARQ scheme.
Figure 4:
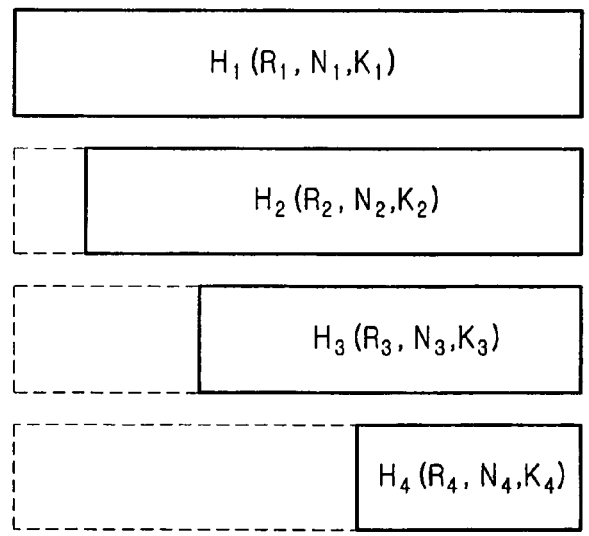
FIG. 4 is a diagram illustrating a process of generating a parity check matrix using a shortening scheme according to the present invention.

FIG. 4 shows a process of generating a parity check matrix using a shortening scheme according to the present invention. $H_i(R_i,N_i,K_i)$ means a parity check matrix of a block LDPC code having a coding rate $R_i$, a codeword length $N_i$, and an information word length $K_i$, and if i<j, then $N_i>N_j$ and $K_i>K_j$.

A process of changing a block LDPC code corresponding to a parity check matrix of $H_1(R_1,N_1,K_1)$ ('$(R_1,N_1,K_1)$-block LDPC code') into a block LDPC code corresponding to a parity check matrix of $H_2(R_2,N_2,K_2)$ ('$(R_2,N_2,K_2)$-block LDPC code') can be simply analogized assuming that first $(K_1-K_2)$ information word bits of the $(R_1,N_1,K_1)$-blck LDPC code are all fixed to '0'. In addition, the $(R_i,N_i,K_i)$-block LDPC code except for the $(R_2,N_2,K_2)$-block LDPC code can also be simply generated by fixing $(K_1-K_i)$ information word bits of the $(R_1,N_1,K_1)$-block LDPC code to '0'.

Therefore, in the operation of generating a parity check matrix using the shortening scheme, a coding rate of the corresponding block LDPC code can be represented by Equation (1)

$$R_1 = \frac{K_1}{N_1}, \quad R_i = \frac{K_i}{N_i} = \frac{K_1 - (K_1 - K_i)}{N_1 - (K_1 - K_i)} \qquad (1)$$

If i<j, Equation (1) can be rewritten as Equation (2)

$$R_i - R_j = \frac{K_1 - (K_1 - K_i)}{N_1 - (K_1 - K_i)} - \frac{K_1 - (K_1 - K_j)}{N_1 - (K_1 - K_j)} \qquad (2)$$
$$= \frac{(N_1 - K_1)(K_i - K_j)}{(N_1 - (K_1 - K_i))(N_1 - (K_1 - K_j))}$$
$$> 0$$

It can be understood from Equation (2) that the coding rate is reduced when a parity check matrix is generated using the shortening scheme.

In addition, if it is assumed in FIG. 4 that the parity check matrix $H_1(R_1,N_1,K_1)$ has a full rank, even though the parity check matrix is generated using the shortening scheme, the number of rows in the parity check matrix generated using the shortening scheme remains constant. Therefore, the information word length is reduced while the parity length remains constant, so the coding rate is reduced.

Generally, if a column mapped to the parity is removed from a preset parity check matrix, a codeword set is generated which is totally different from the codeword set generated when the column mapped to the parity is not removed, so the shortening scheme has a basic principle of removing the column mapped to the information word.

The puncturing scheme increases a coding rate by transmitting only a part of the generated parity rather than transmitting the entire parity generated from an encoder, like the convolutional encoder. Although the puncturing scheme does not transmit the whole of the generated parity, it can be substantially considered that there is no change in the parity check matrix. Therefore, the puncturing scheme is different from the shortening scheme that erases the rows and columns of the parity check matrix. An operation of generating a parity check matrix using the puncturing scheme will be described below.

When a codeword of a given block LDPC code is divided into an information word and a parity, the information work and the parity can also be divided in units of blocks. Therefore, the codeword of the given block LDPC code can be expressed as Equation (3)

$$\underline{c} = (\underline{u}_1, \underline{u}_2, \ldots, \underline{u}_{20}, \underline{p}_1, \underline{p}_2, \ldots, \underline{p}_{20}) \qquad (3)$$

In Equation (3), $\underline{e}_i$ and $\underline{p}_i$ each mean a 1×43 row vector.

Meanwhile, a codeword transmitted through parity puncturing of a regular pattern can be shown in Equation (4) below. That is, Equation (4) means a codeword of a block LDPC code obtained by puncturing even blocks from the parity part corresponding to the parity.

$$\underline{c}_{punc} = (\underline{u}_1, \underline{u}_2, \ldots, \underline{u}_{20}, \underline{p}_1, \underline{p}_3, \underline{p}_5, \ldots, \underline{p}_{17}, \underline{p}_{19}) \qquad (4)$$

In Equation (4), $\underline{c}_{punc}$ means a codeword of the punctured block LDPC code. As a result, the codeword shown in Equation (4) is equal to the codeword of a rate=⅔ block LDPC code. That is, when the puncturing scheme is used, the coding rate undergoes a change, but a length of the codeword remains constant.

In a decoding process for a codeword of the block LDPC code generated using the puncturing scheme, the original parity check matrix can be used as it is, by considering the punctured parity bits as erased bits. That is, if a Log-Likelihood Ratio (LLR) value input from the channel where the punctured parity bits are transmitted is always regarded as '0', the original parity check matrix can be used as it is during decoding.

Therefore, a node corresponding to the punctured parity never affects the performance improvement or performance degradation due to iterative decoding in the decoding process, and simply serves as a path where messages delivered from other nodes are transferred. A description will now be made of a function of a node corresponding to a parity punctured with the use of the puncturing scheme in a decoding process for a codeword of the block LDPC code generated using the puncturing scheme.

FIGS. 5A to 5D show a function of a node corresponding to a punctured parity in a decoding process for a codeword of a block LDPC code generated using a puncturing scheme according to the present invention.

It should be noted in FIGS. 5A to 5D that ⓧ means a node corresponding to the punctured parity, and arrows mean the directions where messages are actually delivered.

Figure 5A:
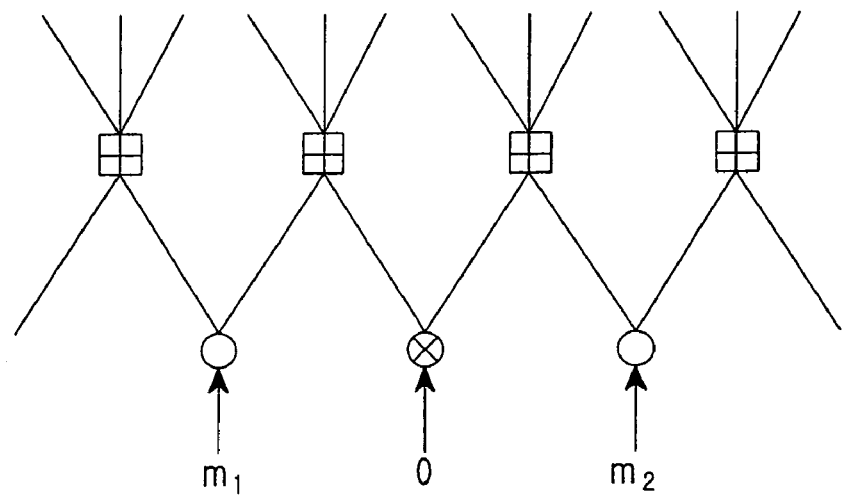
FIGS. 5A to 5D are diagrams shown for a description of a function of a node corresponding to a punctured parity in a decoding process for a codeword of a block LDPC code generated using a puncturing scheme according to the present invention.
Figure 5B:
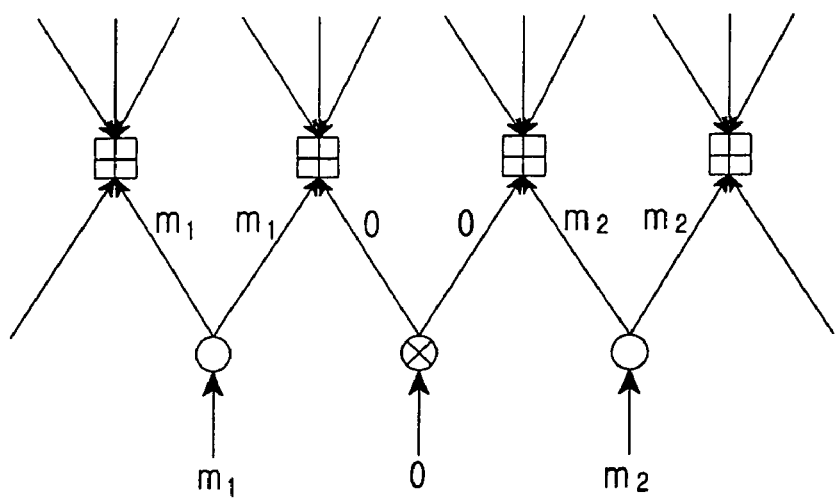

As shown in FIG. 5A, it can be noted that an LLR value '0' is input to a node corresponding to a punctured parity. Thereafter, a message input from the channel shown in FIG. 5A is delivered to a check node in a first decoding process, as shown in FIG. 5B. In FIG. 5B, variable nodes are delivered to the check node connected to the input message, i.e. connected to the symbol probability value. The node corresponding to the parity delivers the LLR value '0' to the connected check nodes.

Figure 5C:
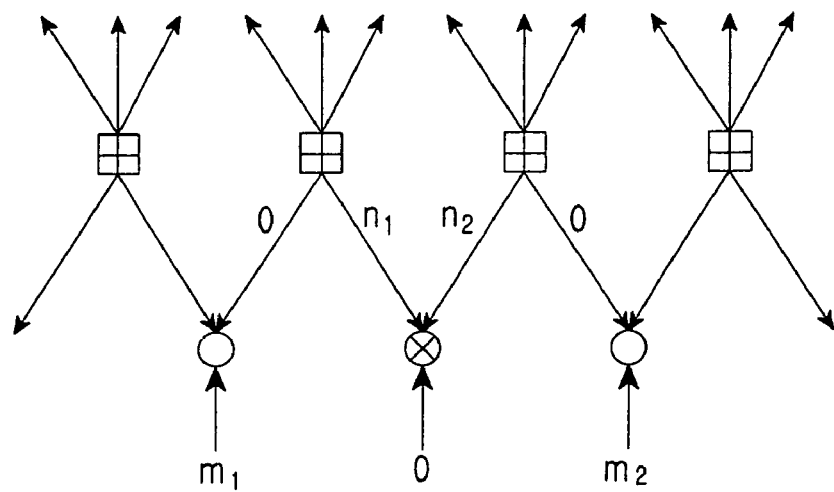
Figure 5D:
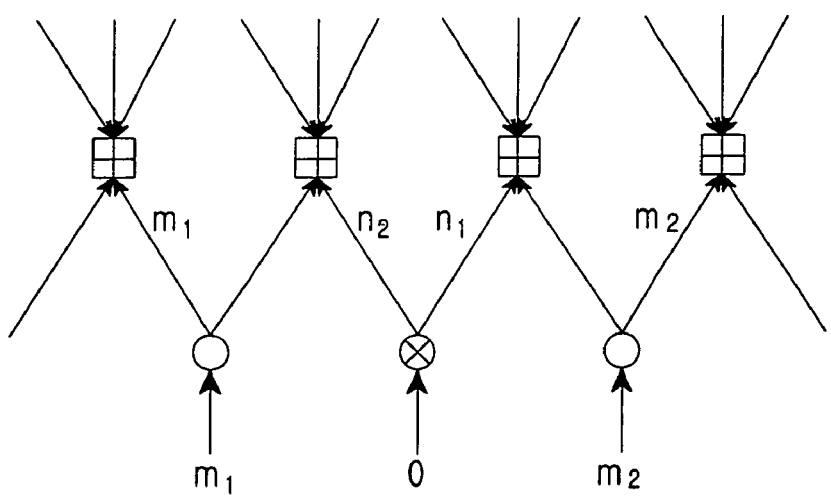

Meanwhile, the check nodes perform a predetermined operation using probability values input from variable nodes connected to the check nodes to calculate the probability values to be delivered to their associated variable nodes, and delivers the calculated probability values to the corresponding variable nodes. The message delivered from the check node to all nodes connected to the node corresponding to the punctured parity becomes '0' as shown in FIG. 5C. In addition, the message delivered to the node corresponding to the punctured parity is not '0' and the messages delivered to the nodes corresponding to the punctured parity are delivered according to their paths without causing interference to each other, as shown in FIG. 5D.

The following decoding process is equal to the decoding process of the general LDPC code, and the node corresponding to the punctured parity simply serves as a delivery path of the messages without continuously affecting performance improvement due to the decoding.

As described above, when the puncturing scheme is used, the initially provided encoder and decoder can be used as they are during coding and decoding. That is, the puncturing scheme has high reliability because its coding complexity and decoding complexity are almost constant regardless of a coding rate and a block (codeword) length, and the information word length is fixed and only the parity length is changed to vary the coding rate. The block LDPC code generated using the puncturing scheme can differ in performance according to its puncturing pattern, so it is also very important to optimally design the puncturing pattern.

The extending scheme reduces a coding rate by increasing the number of independent rows of the parity check matrix. Increasing the number of rows in the parity check matrix of the block LDPC code refers to increasing the number of check equations that the codeword should satisfy. An increase in the number of check equations causes a decrease in the number of codewords satisfying the check equations. Therefore, when the extending scheme is used, the number of parity bits of the block LDPC code increases in the fixed codeword length, reducing the coding rate. A description will now be made of an operation of generating a parity check matrix using the extending scheme.

Figure 6:
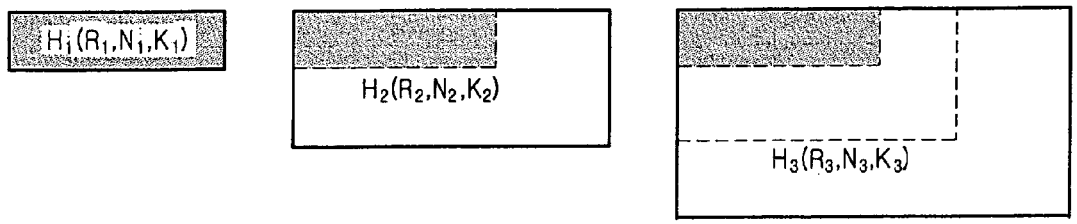
FIG. 6 is a diagram illustrating a process of generating a parity check matrix using an extending scheme according to the present invention.

FIG. 6 shows a process of generating a parity check matrix using an extending scheme according to the present invention. $H_i(R_i,N_i,K_i)$ means a parity check matrix of a block LDPC code having a coding rate $R_i$, a codeword length $N_i$, and an information word length $K_i$, and if i<j, then $N_i>N_j$ and $K_i>K_j$.

If it is assumed herein that each of the parity check matrixes of a block LDPC code shown in FIG. 6 has a full rank $M_i$, a coding rate of a code generated according to each of the parity check matrixes of the block LDPC code can be expressed as Equation (5)

$$R_i = \frac{N_i - M_i}{N_i} = 1 - \frac{M_i}{N_i} \tag{5}$$

In Equation (5), $N_i$ denotes the number of columns of a parity check matrix, and $M_i$ denotes the number of independent rows. As shown in Equation (5), if the extending scheme is applied, the full rank $M_i$ increases for all i, so the coding rate $R_i$ decreases.

In contrast to the foregoing extending scheme, a scheme of erasing rows on the basis of a parity check matrix having a very low coding rate like $H_i(R_i,N_i,K_i)$ may generate a parity check matrix having a high coding rate.

The pruning scheme increases a coding rate by decreasing the number of independent rows of the parity check matrix. Herein, decreasing the number of rows in a parity check matrix of the block LDPC code refers to decreasing the number of check equations that the codeword should satisfy. A decrease in the number of the check equations causes an increase in the number of codewords satisfying the check equations. Therefore, when the pruning scheme is used, the number of parity bits decreases in the fixed codeword length, increasing the coding rate. A description will now be made of an operation of generating a parity check matrix using the pruning scheme.

Figure 7:
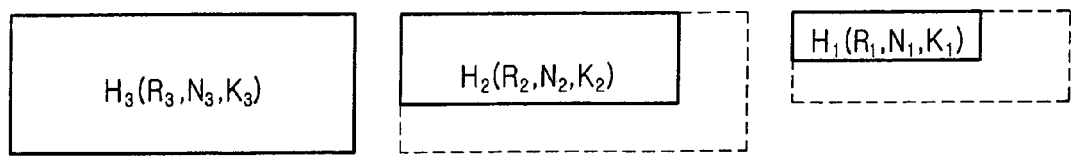
FIG. 7 is a diagram illustrating a process of generating a parity check matrix using a pruning scheme according to the present invention.

FIG. 7 shows a process of generating a parity check matrix using a pruning scheme according to an embodiment of the present invention. $H_i(R_i,N_i, K_i)$ means a parity check matrix of a block LDPC code having a coding rate $R_i$, a codeword length $N_i$, and an information word length $K_i$, and if i<j, then $N_i>N_j$ and $K_i>K_j$.

As illustrated, the pruning scheme shown in FIG. 7 is performed in the reverse way of the extending scheme shown in FIG. 6. Therefore, unlike the extending scheme of FIG. 6 that increases the number of parity bits in the fixed codeword length, thus reducing the coding rate, the pruning scheme decreases the number of parity bits in the fixed codeword length, thus increasing the coding rate.

Various rate-compatible block LDPC codes have been proposed using the above-described shortening scheme, puncturing scheme, extending scheme, and pruning scheme, and will be summarized as follows.

First, a rate-compatible block LDPC code generated using only the puncturing scheme will be described. The method of using only the puncturing scheme designs an LDPC code having the lowest coding rate, and creates the LDPC codes having high coding rates using only the puncturing scheme.

Next, a rate-compatible block LDPC code generated using the extending scheme will be described. The method of using only the extending scheme designs an LDPC code having the highest coding rate, and creates the LDPC codes having low coding rates using only the extending scheme.

Next, a rate-compatible block LDPC code generated using the puncturing scheme and the extending scheme will be described. The method of using the puncturing scheme and the extending scheme designs an LDPC code having an intermediate coding rate, creates LDPC codes having lower coding rates using the extending scheme, and creates LDPC codes having higher coding rates using the puncturing scheme.

Next, a rate-compatible block LDPC code generated using the puncturing scheme and the shortening scheme will be described. The method of using the puncturing scheme and the shortening scheme designs an LDPC code having an intermediate coding rate, creates LDPC codes having lower coding rates using the shortening scheme, and creates LDPC codes having higher coding rates using the puncturing scheme.

As described above, the methods proposed up to now first design a block LDPC code having excellent performance for a particular coding rate, and design the other codes using the puncturing scheme, the shortening scheme, the extending scheme, and the pruning scheme. However, the LDPC codes generated using these methods are inferior to the block LDPC codes having good performance for all coding rates.

Therefore, a description will now be made of a method for designing a rate-compatible block LDPC code by adjusting coding rates of the shortening scheme, the puncturing scheme, the extending scheme, and the pruning scheme, and of its necessity.

A description will first be made of a relationship between the coding rate adjusting method and a Tanner graph of a block LDPC code.

The shortening scheme inputs a known value, generally '0', to particular positions of an information node in order to reduce a coding rate of an LDPC code. The corresponding information node is called a 'known information node'. An LLR message delivered from the known information node to a check node has a positive infinite value (+∞). That is, it can be understood from Equation (6) that the line connected from the information node to the check node is removed.

$$m_u = \log\left(\frac{1 + \prod_i \tanh\frac{1}{2}m_i}{1 - \prod_i \tanh\frac{1}{2}m_i}\right) \tag{6}$$

In Equation (6), $m_u$ denotes a message delivered from a check node to a variable node, and $m_i$ denotes a message delivered from a variable node to a check mode. For the message delivered from the known information node to the check node, $m_i=\infty$ and $\tan h(\infty)=1$. That is, because the product is '1', the corresponding node is not taken into consideration. Therefore, the line can be removed from the check node. That is, it can be noted that a degree of the check node is reduced.

Next, the puncturing scheme punctures particular positions of the variable node including a parity node and an information node in order to increase a coding rate of the LDPC code. Generally, the puncturing scheme punctures a low-degree parity node. In addition, an LLR message delivered from the channel to the punctured variable node during decoding corresponds to '0'. Commonly, in the process of calculating a message delivered from the check node to the variable node, if the punctured node is included in the variable node, reliability of the message is lower than that in the case where the punctured node is not included.

A reliability of the message of the check node decreases as the degree of the check node increases, so the puncturing scheme contributes to an increase in the degree of the check node. An effect of the increase in the degree of the check node may differ according to a structure of the LDPC code and its associated puncturing pattern.

The extending scheme is a scheme of increasing a degree of the variable node in order to increase a coding rate of the LDPC code. Generally, the extending scheme increases a degree of an information node among variable nodes.

The pruning scheme is a scheme of pruning a line connected to an independent check node among the lines connected to the variable nodes, compared with the extending scheme. Generally, the pruning scheme is performed on the information node, and a degree of the information node decreases.

As described above, the method of using only the puncturing scheme adjusts a coding rate of the LDPC code by changing only the degree of the check node. The method of using only the extending scheme adjusts a coding rate of the LDPC code by changing only the degree of the variable node. The method of using the puncturing scheme and the extending scheme adjusts a coding rate of the LDPC code by increasing the degree of the variable node for the coding rates from the mother code, and increasing the degree of the check node for the high coding rates. The method of using the puncturing scheme and the shortening scheme adjusts a coding rate of the LDPC code by decreasing the degree of the check node for the low coding rates from the mother code, and increasing the degree of the check node for the high coding rates.

A description will now be made of a degree of a check node and a degree of a variable node for an LDPC code having good performance for every coding rate. When a coding rate is changed, all of the following possible cases can occur: one case where the degree of the check node and the degree of the variable node are simultaneously changed, another case where only the degree of the check node is changed, and further another case where only the degree of the variable node is changed.

However, the proposed rate-compatible block LDPC codes cannot be supported when the degree of the check node and the degree of the variable node are simultaneously changed. In particular, for a wide-range coding rate, the degree of the check node and the degree of the variable node are simultaneously changed. Therefore, the conventional rate-compatible LDPC code suffers considerable performance degradation, when it has a wide-range coding rate that should be supported.

Therefore, the present invention provides a method for designing a rate-compatible block LDPC code that can satisfy all of the above cases.

The present invention provides a method for designing a rate-compatible block LDPC code capable of supporting, for example, coding rates $R_1 < R_2 < \ldots R_m$ with one parity check matrix. To this end, the present invention can be divided into, for example, the following five steps, and can design the rate-compatible block LDPC code through the steps.

Step 1: For a coding rate $R_m$, optimization of degree distribution is performed using a density evolution technique. Assuming that a ratio of variable nodes with a degree j ($1 \leq j \leq d_{v,max}$) to all the variable nodes is $f_{mj}$ in the degree distribution obtained as a result of the optimization, the $f_{mj}$ and the degree distribution $\lambda_{mj}$ of the edge can be mutually modified using the relationship defined as Equation (7)

$$f_{m,j} = \frac{\lambda_{m,j}/j}{\sum_k \lambda_{m,k}/k} \leftrightarrow \lambda_{m,j} = \frac{j \cdot f_{m,j}}{\sum_k k \cdot f_{m,k}} \quad (7)$$

where a degree of the check node is assumed as $d_{c,m}$.

Step 2: For l, m−1, m−2, . . . , 1, a degree distribution $f_{lj}$ of a variable node of a block LDPC code is found by satisfying the condition that a degree of each variable node should increase from or be matched to the degree distribution found in the previous step. However, there is no separate condition for the degree of the check node. In addition, in Step 2, a pruning pattern is generated by comparing degree distributions of individual variable nodes. A reduction in the degree of the variable node corresponds to the pruning.

Step 3: In order to express m LDPC codes with the same parity check matrix, degrees of the check nodes should be matched. That is, in order to express m parity check matrixes with one check matrix, the number of 1's per row of m parity check matrixes should necessarily be matched, and this is equal to the process of matching the degrees of the check nodes.

The matched degree $d_c$ of the check node can be calculated by Equation (8) below, and the calculated value becomes a degree of the check node of the rate-compatible block LDPC code. That is, m block LDPC codes are changed to m punctured LDPC codes having the degree $d_c$ of the check node without a change in the performance. For the structured LDPC codes such as Irregular Repeat Accumulate (IRA) code, Concatenated Zigzag (CZZ) code, block LDPC code, etc., the $d_c$ can be calculated by Equation (8)

$$d_c = gcd(d_{c,1}-2, d_{c,2}-2, \ldots, d_{c,m}-2)+2 \quad (8)$$

where gcd denotes the greatest common divisor.

The process where the LDPC code is changed to a punctured LDPC code without performance degradation can differ according to structure of the LDPC code. That is, the IRA code and the block LDPC code are different in the process.

Step 4: The m punctured LDPC codes are combined into one rate-compatible LDPC code. Assuming that the m puncturing patterns generated in Step 3 are defined as $(P_1) < (P_2) < \ldots (P_m)$, if Condition 1 below is satisfied, performance degradation never occurs in the process where the m punctured LDPC codes are made into one rate-compatible LDPC code.

Condition 1

For all i, $(P_i)$ is a prime factor of $(P_j)$, where j=i+1, . . . m.

Step 5: If Condition 1 is unsatisfied, a property of a variable coding rate is given to the m puncturing patterns generated in Step 3. The puncturing patterns are designed such that the conventional puncturing patterns are maintained if possible. However, Condition 2 below should be satisfied.

Condition 2

The rate-compatible puncturing patterns are formed while the property of the puncturing pattern corresponding to the low coding rate is maintained if possible.

Next, a description will be made of a process where the LDPC code is changed to the same punctured LDPC code as the LDPC code in Step 3, using the IRA code and the block LDPC code through the first and second embodiments. This method can be applied even to the general LDPC code.

Before the below descriptions of the present invention are given, the concept of a 'logical check node degree' in the present invention will be defined as follows.

Logical Check Node Degree

Commonly, the check node degree indicates the number of lines connected to the check nodes in the Tanner graph or biparti graph indicating an LDPC code. In addition, reliability of a message delivered from a check node to a variable node is higher, as a degree of the check node is lower. It is assumed herein that a check node degree of an LDPC code A is denoted by $d_{c,A}$, a degree of a check node of an LDPC code B is denoted by $d_{c,B}$, a degree of a check node of an LDPC code C is denoted by $d_{c,C}$, and the degrees $d_{c,A}$, $d_{c,B}$ and $d_{c,C}$ of the respective check nodes satisfy Equation (9) below.

$$d_{c,A} = d_{c,B} < d_{c,C} \qquad (9)$$

If puncturing is applied to the LDPC code B, reliability of a message delivered from a check node of the LDPC code B to a variable node is lower, compared with the LDPC code A. If there is an LDPC code C having the same reliability as that of the above message, the $d_{c,C}$ can be defined as a logical check node degree of the LDPC code B and can be expressed as Equation (10)

$$lo(d_{c,B}) = d_{c,C} > d_{c,A} \qquad (10)$$

Figure 8:
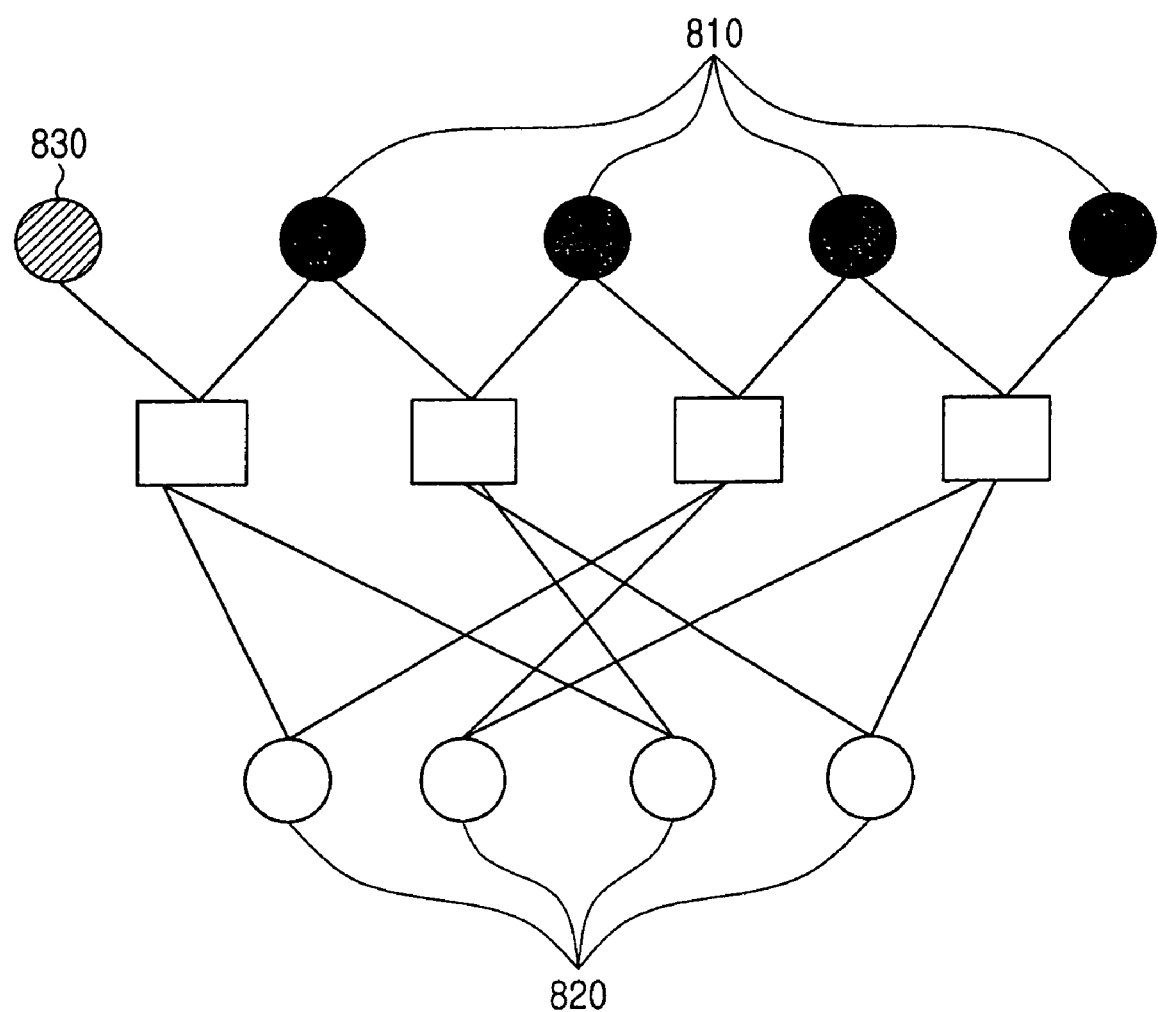
FIG. 8 is a diagram illustrating a Tanner graph of an (8,4)-IRA code with a coding rate ½ according to the present invention.

FIG. 8 shows a Tanner graph of an (8,4)-IRA code with a coding rate ½ according to one example of the present invention.

Referring to FIG. 8, there is shown a process of Step 3 for an IRA code which is a structured LDPC code that is possible for fast decoding and shows good performance. Black circles 810 mean parity nodes, white circles 820 information nodes, and a hatched circle 830 means a reference node always having a value '0'. The reference node, as it is not a value transmitted, is excluded from coding rate calculation, and the puncturing is performed only for the parity bits.

A puncturing pattern (p) means that the last (p−1) parity bits are punctured every p parity bits. The check node degree of the IRA code can be expressed as Equation (11)

$$lo(d_c) = (d_c - 2)p + 2 \qquad (11)$$

That is, the IRA code with a check node degree $lo(d_c)$ is equal in terms of performance to the punctured IRA code having a check node degree $d_c$ and a puncturing pattern (p).

Figure 9:
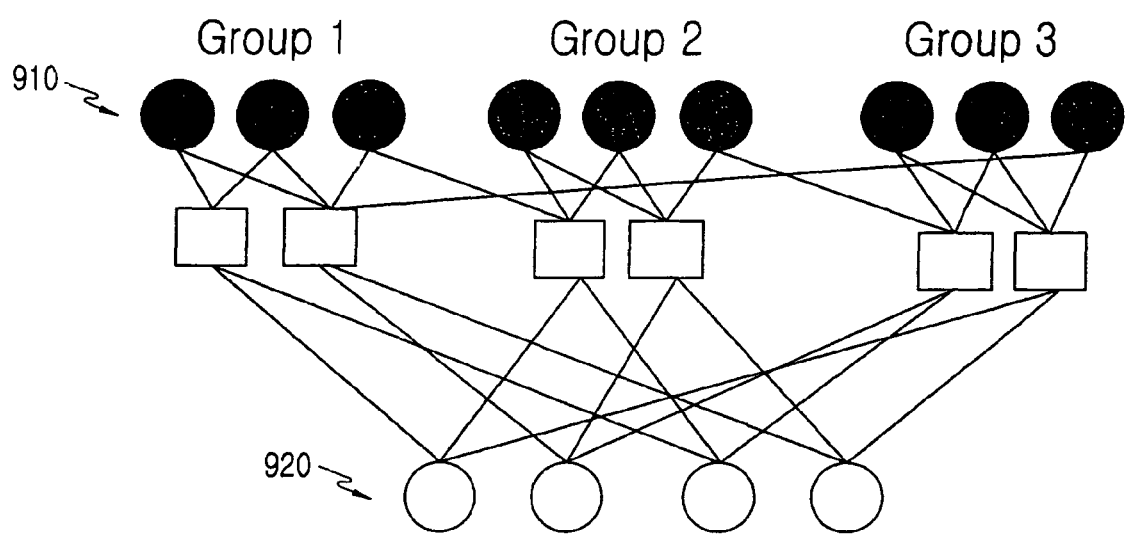
FIG. 9 is a diagram illustrating a Tanner graph of a block LDPC code according to the present invention.

FIG. 9 shows a Tanner graph of a block LDPC code according to another example of the present invention.

Black circles 910 mean parity nodes, and white circles 920 mean information nodes. FIG. 9 shows a process of Step 3 for a block LDPC code, where a structure of a simple block LDPC code where the number of parity bits in a base matrix is 3 and a size of a circulant matrix is 3. Puncturing is performed only for the parity bits, and a puncturing pattern (p) indicates that the last (p−1) parity bits are punctured every p parity bits. The check node degree of the block LDPC code can be expressed as Equation (12)

$$lo(d_c) = (d_c - 2)p_G + 2 \qquad (12)$$

When the puncturing pattern is applied for the block LDPC code, the puncturing is performed in groups.

That is, assuming that P(i) (where i=1, 2, ..., $N_p$) are parity bits generated from a block LDPC code, the parity bits are first divided into $N_q$ groups. $N_q$ denotes the number of parity bits in a base parity check matrix of the block LDPC code, and each of the groups includes $N_e$ parity bits, where $N_e$ denotes a size of the circulant matrix. Then, for the $N_g$ and $N_e$, a parity bit $N_p$ generated from the block LDPC code can be expressed as Equation (13)

$$N_p = N_e N_g \qquad (13)$$

In addition, parity bits for each group are divided as shown in Equation (14):

$$G(i) = (P(iN_e), P(iN_e+1), \ldots, P((i+1)N_e-1)) \qquad (14)$$

As shown in Equation (14), the parity bits in each group are equal in terms of whether they are punctured or not. That is, the punctured G(i) means that all parity bits belonging to the G(i) are punctured. As shown above, the puncturing pattern ($P_G$) is applied in groups. For example, a puncturing pattern (2) means that all parity bits belonging to a group G(i) (where i=1, 3, 5, 7, ...) are punctured.

Next, a detailed description will be made of a process of designing a rate-compatible LDPC code based on a structure of the IRA code described above. That is, a rate-compatible LDPC code capable of supporting coding rates ⅙, ⅜, ¾ and 24/25 is designed for the IRA code, by way of example.

First, an IRA code having good performance is designed for each coding rate as shown in Table 1 below. The design is achieved using the density evolution technique. Because the density evolution technique is a known technique, a detailed description thereof will be omitted.

TABLE 1

| Coding Rate | Degree of Check Node | Degree of Variable Node | Node Ratio |
|---|---|---|---|
| Coding Rate ⅙ | 3 | 2 | ⅚ |
|  |  | 4 | 1/18 |
|  |  | 7 | 2/18 |
| Coding Rate ⅜ | 5 | 2 | ⅝ |
|  |  | 4 | ⅖ |
|  |  | 7 | ⅛ |
| Coding Rate ¾ | 14 | 2 | ¼ |
|  |  | 4 | ¾ |
| Coding Rate 24/25 | 98 | 2 | 1/25 |
|  |  | 4 | 24/25 |

For the four types of IRA codes designed as shown in Table 1, degrees of check nodes should be matched. The process of matching the degrees of the check nodes is essential for combining four parity check matrixes into one parity check matrix. The process finds a degree of a check node that should be matched, from the greatest common divisor of 1, 3, 12 and which are determined by subtracting 2 from the degree of the check node using Equation (8). That is, each code is converted into a punctured IRA code with a check node degree of gcd(1,3,12,96)+2.

For the coding rate ⅙, because degrees of checks node of the designed code are equal to 3, there is no change in the puncturing pattern. For the coding rate ⅜, 2 bits are punctured every 3 parity node bits while the degree of the check node of the designed code is changed from 5 to 3. That is, the puncturing pattern becomes (3). For the coding rate ¾, 11 bits are punctured every 12 parity node bits while the degree of the check node of the designed code is changed from 14 to 3. That is, the puncturing pattern becomes (12). For the coding rate 24/25, 95 bits are punctured every 98 bits while the degree of the check node of the designed code is changed from 98 to 3. That is, the puncturing pattern becomes (96).

Next, a property of a variable coding rate is given to every puncturing pattern as described above. That is, it can be understood in the foregoing embodiment that the puncturing patterns (3), (12) and (96) for the coding rates satisfy Condition 1. That is, 4 IRA codes can be expressed using a parity check matrix of one rate-compatible LDPC code, without performance degradation.

A rate-compatible LDPC code finally designed by the above process is shown in Table 2 below.

TABLE 2

| Degree of Check Node | Degree of Variable Node | Node Ratio |
| --- | --- | --- |
| 3 | 2 | 5/6 |
|   | 4 | 1/18 |
|   | 7 | 2/18 |

A puncturing pattern and a pruning pattern for each coding rate will be summarized as follows.

(1) For the coding rate 1/3: the LDPC code is created by puncturing 2 bits from the mother code every 3 bits.

(2) For the coding rate 3/4: a pruning scheme is used which first prunes 3 lines from the mother code for the information nodes with a degree 7 to create an information node with a degree 4. For the remaining parity bits, the scheme punctures 11 parity bits every 12 bits. Of the 11 punctured bits, 2 bits include the bits punctured at the coding rate 1/3 of (1).

(3) For the coding rate 24/25: a pruning scheme is used which prunes 3 lines from the mother code for the information nodes with a degree 7 to create an information node with a degree 4. For the remaining parity bits, the scheme punctures 95 parity bits every 96 bits. Of the 15 punctured bits, 11 bits include the bits punctured at the coding rate 3/4 of (2).

Figure 10:
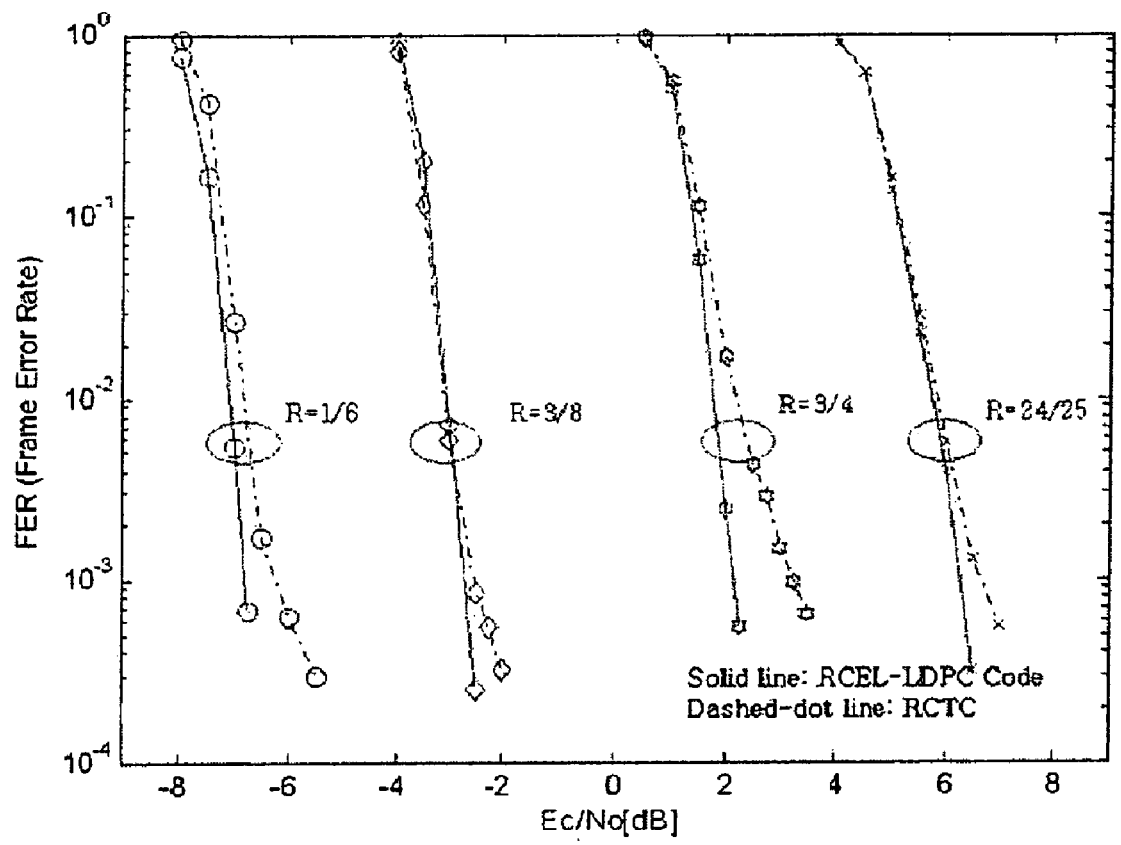
FIG. 10 is a diagram illustrating a graph for performance comparison between a novel rate-compatible block LDPC code and an RCTC code.

Performance of the rate-compatible LDPC code generated through the above procedure proposed by the present invention is shown in FIG. 10. The performance graph is compared with a rate-compatible turbo code (RCTC), and it can be noted that the proposed rate-compatible LDPC code is superior to the RCTC in performance.

Figure 11:
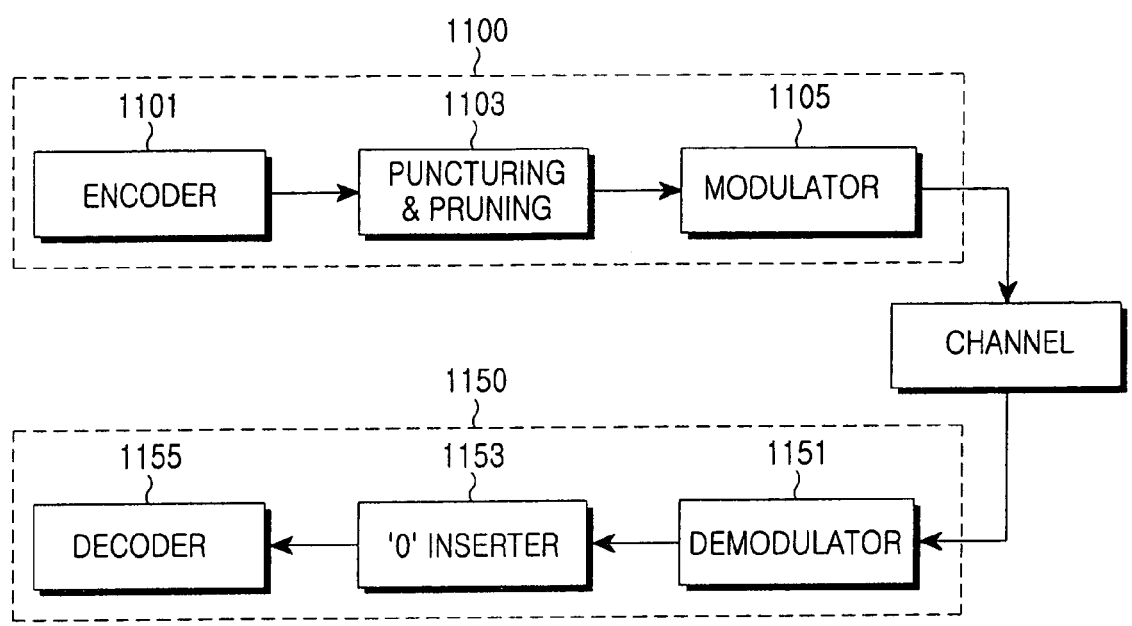
FIG. 11 is a diagram illustrating a structure of a transceiver using a rate-compatible block LDPC code according to the present invention.

FIG. 11 shows a structure of a transceiver for a communication system according to the present invention. A transmitter 1100 includes an encoder 1101, a puncturing and pruning unit 1103, and a modulator 1105, and a receiver 1150 includes a demodulator 151, a '0' inserter 1153, and a decoder 1155.

If information data that the transmitter 1100 desires to transmit is generated, the information data is delivered to the encoder 1101. The encoder 1101 encodes the information data into coded symbols with a predetermined coding scheme, and outputs the coded symbols to the puncturing & pruning unit 1103. The puncturing and pruning unit 1103 punctures/prunes a predetermined number of coded symbols from the symbols received from the encoder 1101 according to the coding rate information set in the system, and provides the result to the modulator 1105. That is, the puncturing & pruning unit 1103, as described above, performs pruning on an information node for generating an information node corresponding to a set degree from a mother code for each coding rate. Thereafter, the puncturing & pruning unit 1103 punctures a predetermined number of bits every parity bits given for each coding rate, for the parity bits left after the pruning. The modulator 1105 modulates the coded symbols into modulation symbols with a predetermined modulation scheme, and transmits the modulation symbols over the air via an antenna of the transmitter 1100.

The signal transmitted over the air by the transmitter 1100 is received over a channel via an antenna of the receiver 1150, and the signal received via the antenna is delivered to the demodulator 1151. The demodulator 1151 demodulates the signal transmitted from the transmitter 1100 with a demodulation scheme corresponding to the modulation scheme used in the modulator 1105 of the transmitter 1100, and provides the demodulated signal to the '0' inserter 1153. The '0' inserter 1153 inserts '0's in the received information bit steam provided from the demodulator 1151 according to the coding rate information set in the system, and provides the result to the decoder 1155. The decoder 1155 decodes the signal output from the '0' inserter 1153 with a decoding scheme corresponding to the coding scheme used in the encoder 1101 of the transmitter 1100, and outputs the decoded signal as the finally recovered information data.

Figure 12:
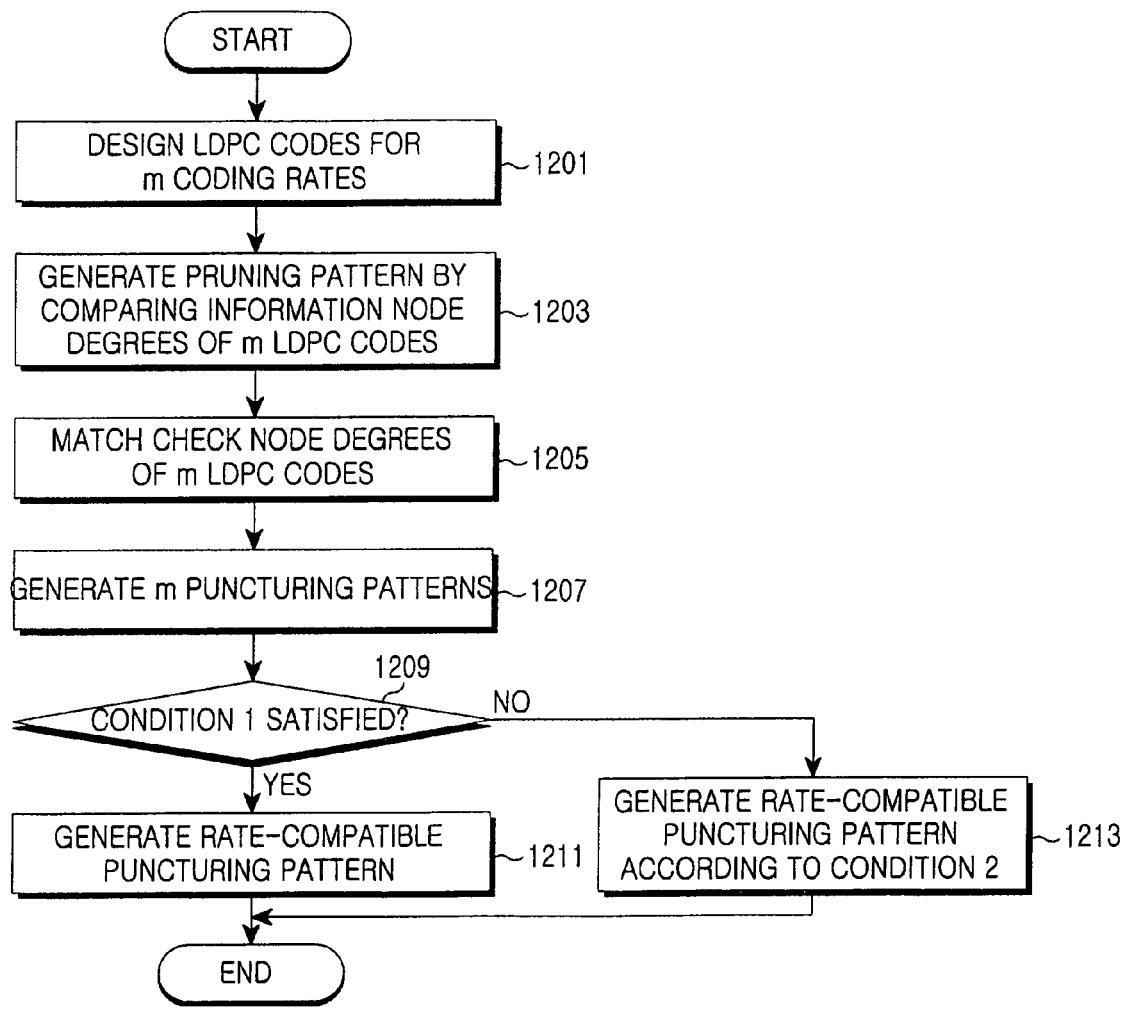
FIG. 12 is a diagram illustrating a method of generating rate-compatible puncturing patterns and pruning patterns according to the present invention.

FIG. 12 shows a method of generating a rate-compatible block LDPC code according to the present invention. Five steps are shown of designing a rate-compatible block LDPC code according to the present invention. In step 1201, specific LDPC codes, for example, block LDPC codes, IRA codes and CZZ codes are designed for m coding rates. In step 1203, a pruning pattern is generated by comparing information node degrees of the m LDPC codes.

In step 1205, check node degrees of the m LDPC codes are matched. The matched degrees of the check nodes can be calculated using Equation (8). Once the matched degrees of the check nodes are calculated, m puncturing patterns are generated according to the check node degree in step 1207.

In step 1209, it is determined whether a condition given for the generated puncturing patterns, i.e. a first condition, is satisfied. If the puncturing patterns satisfy the first condition in step 1209, the generated puncturing patterns are determined as rate-compatible puncturing patterns in step 1211. However, if the puncturing patterns do not satisfy the first condition in step 1209, rate-compatible puncturing patterns are generated according to a condition given for the generated m puncturing patterns, i.e. a second condition, in step 1213.

As can be understood from the foregoing description, the present invention proposes a rate-compatible block LDPC code in a mobile communication system, thereby improving flexibility of a block LDPC code. In addition, the present invention minimizes coding complexity of a rate-compatible block LDPC code by generating an efficient parity check matrix. Further, the present invention minimizes hardware complexity by facilitating generation of a block LDPC code that can be applied to various coding rates.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for encoding a rate-compatible block Low Density Parity Check (LDPC) code, the method comprising the steps of:

designing, by a puncturing unit, specific LDPC codes for a predetermined number of coding rates, and generating a pruning pattern by comparing information node degrees of the predetermined number of LDPC codes;

matching, by the puncturing unit, check node degrees of the predetermined number of LDPC codes;

generating a predetermined number of puncturing patterns according to the check node degrees when the matched check node degrees are calculated;

determining, by the puncturing unit, whether a first condition given for the generated puncturing patterns is satisfied; and determining the generated puncturing patterns as rate-compatible puncturing patterns when the puncturing patterns satisfy the first condition.

2. The method of claim 1, further comprising generating rate-compatible puncturing patterns according to a second condition given for the predetermined number of the generated puncturing patterns when the puncturing patterns do not satisfy the first condition.

3. The method of claim 2, wherein the second condition represents a condition of generating rate-compatible puncturing patterns while maintaining a property of a puncturing pattern corresponding to a low coding rate.

4. The method of claim 1, wherein the step of generating a pruning pattern comprises generating a pruning pattern by comparing degree distribution of each variable node, wherein the pruning pattern reduces the degree of the variable node.

5. The method of claim 1, wherein the step of matching check node degrees comprises matching a number of '1's per row of a predetermined number of parity check matrixes, wherein the matched check node degrees are calculated by an equation $$d_c = gcd(d_{c,1}-2, d_{c,2}-2, \ldots, d_{c,m}-2)+2$$

where $d_c$ denotes a matched check node degree.

6. The method of claim 1, further comprising calculating the matched check node degree, and converting the LDPC codes into a predetermined number of punctured LDPC codes according to the calculated check node degree.

7. The method of claim 6, wherein the LDPC code converting step is differently applied according to structure of the LDPC codes.

8. The method of claim 1, wherein the puncturing pattern generating step comprises combining a predetermined number of punctured LDPC codes changed according to the check node degree, into one rate-compatible LDPC code.

9. The method of claim 1, wherein the first condition is defined so for all i, a puncturing pattern ($P_i$) is a prime factor of ($P_j$), where j=i+1, ..., m.

10. An apparatus for encoding a rate-compatible block Low Density Parity Check (LDPC) code, the apparatus comprising:
an encoder for encoding information data into coded symbols with a predetermined coding scheme;
a puncturing and pruning unit for puncturing a predetermined number of coded symbols from the coded symbols received from the encoder, the predetermined number corresponding to coding rate information set in a system; and
a modulator for modulating the coded symbols into modulation symbols with a predetermined modulation scheme,
wherein the puncturing and pruning unit generates LDPC codes for a predetermined number of coding rates, generates a pruning pattern by comparing information node degrees of a predetermined number of LDPC codes, matches check node degrees of the predetermined number of LDPC codes, generates a predetermined number of puncturing patterns according to the check node degree if the matched check node degree is calculated, compares the puncturing patterns with a first condition, and generates rate-compatible puncturing patterns according to the comparison result.

11. The apparatus of claim 10, wherein the puncturing and pruning unit performs pruning on an information node for generating an information node corresponding to a set degree from a mother code for each coding rate, and punctures a predetermined number of bits every parity bits given for each coding rate, for the parity bits left after the pruning.

12. The apparatus of claim 11, wherein the puncturing and pruning unit generates a pruning pattern by comparing degree distribution of each variable node, and reduces a degree of the variable node according to the pruning pattern.

13. The apparatus of claim 10, wherein the puncturing and pruning unit determines the generated puncturing patterns as the rate-compatible puncturing patterns when the puncturing patterns satisfy the first condition, and the puncturing and pruning unit generates rate-compatible puncturing patterns according to a second condition given for the puncturing patterns when the puncturing patterns do not satisfy the first condition.

14. The apparatus of claim 13, wherein the second condition represents a condition of generating rate-compatible puncturing patterns while maintaining a property of a puncturing pattern corresponding to a low coding rate.

15. The apparatus of claim 10, wherein the puncturing and pruning unit matches the check node degrees by matching a number of '1's per row of a predetermined number of parity check matrixes, wherein the matched check node degrees are calculated by the equation $$d_c = gcd(d_{c,1}-2, d_{c,2}-2, \ldots, d_{c,m}-2)+2$$

where $d_c$ denotes the matched check node degree.

16. The apparatus of claim 10, wherein the puncturing and pruning unit generates puncturing patterns by combining a predetermined number of punctured LDPC codes changed according to the check node degree, into one rate-compatible LDPC code.

17. The apparatus of claim 10, wherein the first condition is defined so for all i, a puncturing pattern ($P_i$) is a prime factor of ($P_j$), where j=i+1, ..., m.

* * * * *